(12) United States Patent
Chou et al.

(10) Patent No.: US 9,194,569 B2
(45) Date of Patent: Nov. 24, 2015

(54) ILLUMINANT DEVICE WITH OVER-TEMPERATURE PROTECTING FUNCTION

(71) Applicant: INTERLIGHT OPTOTECH CORPORATION, Taoyuan (TW)

(72) Inventors: Hsi-Yan Chou, Taoyuan (TW); Yu-Chou Hu, Taoyuan (TW); Fu-Chen Liu, Taoyuan (TW)

(73) Assignee: INTERLIGHT OPTOTECH CORPORATION, Yangmei, Taoyuan County (TW)

( * ) Notice: Subject to any disclaimer, the term of this patent is extended or adjusted under 35 U.S.C. 154(b) by 0 days.

(21) Appl. No.: 13/786,196

(22) Filed: Mar. 5, 2013

(65) Prior Publication Data

US 2014/0252947 A1    Sep. 11, 2014

(51) Int. Cl.
| | |
|---|---|
| F21V 25/10 | (2006.01) |
| F21K 99/00 | (2010.01) |
| H05B 33/08 | (2006.01) |
| F21V 3/00 | (2015.01) |
| F21V 23/02 | (2006.01) |
| F21Y 101/02 | (2006.01) |

(52) U.S. Cl.
CPC . *F21V 25/10* (2013.01); *F21K 9/30* (2013.01); *H05B 33/089* (2013.01); *F21V 3/00* (2013.01); *F21V 23/02* (2013.01); *F21Y 2101/02* (2013.01); *Y02B 20/341* (2013.01)

(58) Field of Classification Search
USPC ............. 315/119, 120, 121, 122; 257/78–103
See application file for complete search history.

(56) References Cited

U.S. PATENT DOCUMENTS

| | | | | |
|---|---|---|---|---|
| 8,445,920 | B1* | 5/2013 | Tsang | 257/79 |
| 2006/0141644 | A1* | 6/2006 | Liu et al. | 438/22 |
| 2008/0083929 | A1* | 4/2008 | Fan et al. | 257/79 |
| 2011/0062871 | A1* | 3/2011 | Chen et al. | 315/121 |
| 2013/0093323 | A1* | 4/2013 | Radermacher | 315/71 |
| 2013/0258658 | A1* | 10/2013 | Hussell et al. | 362/235 |

FOREIGN PATENT DOCUMENTS

| | | |
|---|---|---|
| CN | 2767820 Y | 3/2006 |
| CN | 1769762 A | 5/2006 |

* cited by examiner

*Primary Examiner* — Douglas W Owens
*Assistant Examiner* — Jonathan Cooper
(74) *Attorney, Agent, or Firm* — Muncy, Geissler, Olds & Lowe P.C.

(57) ABSTRACT

An illuminant device includes a housing, a illuminant element, a resistor, and an over-temperature protective element. The housing includes an upper portion, a lower portion opposite to the upper portion, and two accommodating spaces, respectively formed in a first tubular configuration arranged between the upper end and the lower end and a second tubular configuration spatially isolated from the first accommodating space. The illuminant element is placed on the upper portion. The resistor is located within one of the accommodating space and electrically connected to the illuminant element. The over-temperature protective element is located within the other accommodating space and electrically connected to the illuminant element.

13 Claims, 3 Drawing Sheets

ILLUMINANT DEVICE WITH OVER-TEMPERATURE PROTECTING FUNCTION

BACKGROUND OF THE INVENTION

1. Field of the Invention

The present invention relates to an illuminant device, and in particular to an illuminant device with over-temperature protecting function.

2. Description of Related Art

Light emitting diodes (LEDs) have the advantages of small volume, long lifetime, difficulty damage, without mercury and lower power consumption. They are gradually replacing the fluorescent tubes and incandescent lamps and widely used in indoor or outdoor lighting and decorative lighting.

However, in comparison to other lighting source, LEDs with higher power are more prone to a problem of heat dissipation. The main reason is that the heat of the LEDs cannot be dissipated through infrared radiation. Moreover, the multiple packages of the LEDs make junction thermal resistances at different junctions such that the LEDs cannot effectively dissipate heat. In general, over-temperature operation makes the LEDs reduce light output (light attenuation), color shift and accelerate aging to shorten the lifetime of the LEDs.

In order to prevent the LED form aging, color shifting and light attenuation, the LED must prevent from operating under high temperature environment. Reference is made to FIG. 1, which is a circuit diagram of an illuminant device with high temperature cutting function. The illuminant device 10 includes an illuminant element 12, a resistor 14, and a fuse 16. The resistor 12 and the fuse 16 are respectively electrically connected to the illuminant element 12 in series. The illuminant element 12 is alternating current (AC) light emitting diode (LED). The illuminant device 10 is electrically connected to an alternating current power source ACV. The AC power source ACV provides electric power to the illuminant element 12 to light the illuminant element 12.

The fuse 16 is inexpensive, which can effectively reduce manufacturing cost. However, the fuse 16 will be damaged when operating under over high temperature and current. The fuse 16 is a disposable element, when the fuse 16 damages, the circuit includes the fuse 16 is broken because the AC power source ACV cannot conduct to the illuminant element 12, therefore the illuminant element 12 cannot be lit anymore.

Of course, users can replace a new fuse connected to the AC power source ACV and the light emitting element 12, however, the convenience of using the illuminant device 10 is reduced because the fuse 16 cannot automatic reset.

In order to solve the problem mentioned above, some manufacturers propose improved illuminant device 20 as shown in FIG. 2. The illuminant device 20 includes a base 22, a LED 24 and the thermistor 26. The LED 24 and the thermistor 26 are electrically connected to the base 22, respectively. The LED 24 and the thermistor 26 are electrically connected in series via a soldering wire 28. The resistance of the thermistor 26 is sharply increased when an operating temperature of the illuminant device 20 is higher than a predetermined value, thus preventing a power source from conducting to the LED 24.

However, the thermistor 26 and the illuminant element 24 are placed on the same lever, and the thermistor 26 is closed to the LED 24, therefore the thermistor 26 is always operating under high temperature environment, and the sensitivity of the thermistor 26 will be affected, and the thermistor 26 may be damaged. Moreover, the thermistor 26 and the LED 24 are made of semiconductor processing, when the thermistor 26 damages, the illuminant device 20 is unable to be use and user cannot fix the illuminant device 20 by itself. Furthermore, light emitted from the LED 24 is easily be blocked by the thermistor 26, and then decreases the emitting uniformity.

SUMMARY OF THE INVENTION

It is an object to provide an illuminant device with over-temperature protecting function.

Accordingly, the illuminant device comprises a housing, an illuminant device, a resistor, and an over-temperature protecting element. The housing comprises an upper end, a lower end opposite to the upper end, and two accommodating spaces, respectively formed in a first tubular configuration arranged between the upper end and the lower end and a second tubular configuration spatially isolated from the first accommodating space. The illuminant element is located on the upper end. The resistor is located within one of the accommodating space and electrically connected to the illuminant element. The over-temperature element is located within the other accommodating space and arranged between the illuminant element and the lower end.

According to a preferred embodiment of the invention, wherein when a temperature of the illuminant element is higher than a trigger temperature, a resistance of the over-temperature element increases to block the power source from conducting to the illuminant element, when the temperature of the illuminant element is lower than the trigger temperature, the resistance of the over-temperature element decreases, such that the power source is conducted to the illuminant element via the over-temperature element.

According to a preferred embodiment of the invention, wherein the resistor, the illuminant element, and the over-temperature protecting element are electrically connected in series.

According to a preferred embodiment of the invention, wherein the over-temperature protecting element has a characteristic of positive temperature coefficient.

According to a preferred embodiment of the invention, wherein the over-temperature element is thermistor.

According to a preferred embodiment of the invention, wherein the accommodating spaces disposed on the housing are spaced at intervals.

According to a preferred embodiment of the invention, wherein the illuminant element is alternating current light emitting diode (AC LED).

According to a preferred embodiment of the invention, wherein the housing is made of ceramic by sintering.

According to a preferred embodiment of the invention, wherein the illuminant device further comprises a lamp shade and two conductive pins, the lamp shade is assembled with the upper end of the housing, such that the illuminant element is arranged between the housing and the lamp shade, one of the conductive pin is electrically connected to the resistor, and the other conductive pin is electrically connected to the over-temperature element.

According to a preferred embodiment of the invention, the housing is cylinder, and the lamp shade is hemisphere.

The illuminant device according to the present invention via the over-temperature element senses temperatures of the illuminant element, and is configured to selectively break the power source according to the sensed temperature, such that the illuminant device can prevent the illuminant element form aging and light attenuation result in operating under high temperature environment, and thus the lifetime of the illuminant device is increased.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DETAILED DESCRIPTION OF THE INVENTION

A preferred embodiment of the present invention will be described with reference to the drawings.

Figure 1:
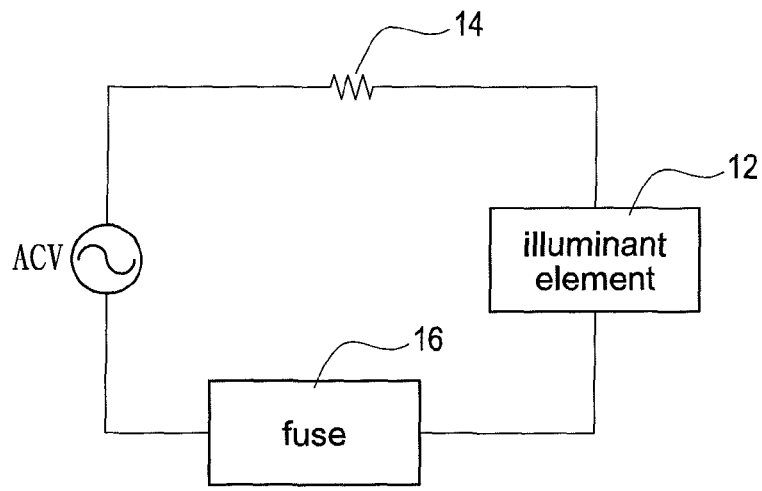
FIG. 1 is a circuit diagram of a conventional illuminant device with high temperature cutting function.
Figure 2:
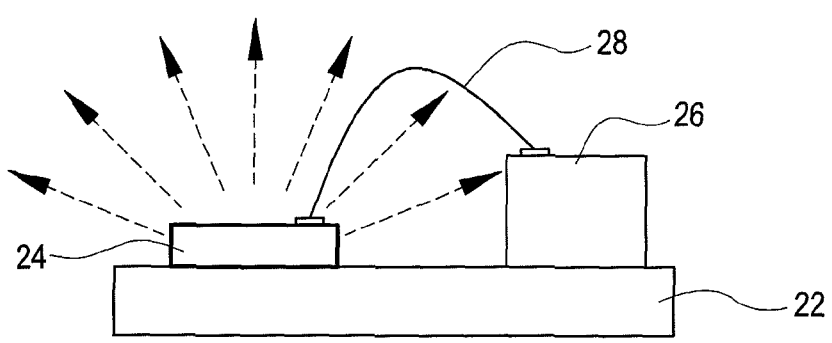
FIG. 2 is a sectional view of another conventional illuminant device.
Figure 3:
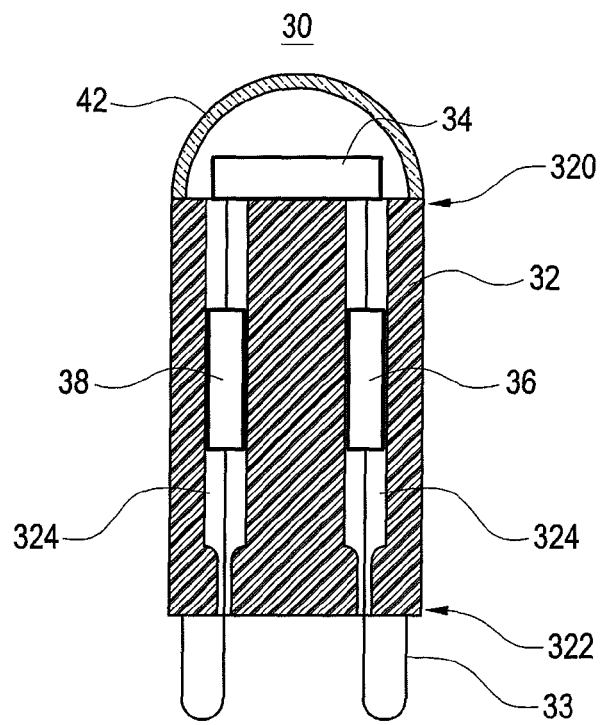
FIG. 3 is a sectional view of an illuminant device with over-temperature protecting function according to the present invention.

Reference is made to FIG. 3, which is a sectional view of an illuminant device with over-temperature protecting function. The illuminant device with over-temperature protecting function 30 includes a housing 32, an illuminant element 34, a resistor 36, and an over-temperature protecting element 38. The illuminant device with over-temperature protecting function 30 cuts off the current conducting to the illuminant element 34 when an operating temperature of the illuminant element 34 is higher than a trigger temperature Tt, so as to prevent the illuminant element 34 from damaging.

The housing 32 is made of ceramic by sintering, such that the housing 32 can have high heat tolerance and thermal expansion coefficient close to component made by semiconductor processing. The profile of the housing 32 can be cylinder, polygon pillar, irregular pillar or poculiform as general lamps. The housing 32 includes an upper end 320, a lower end 322 opposite to the upper end 320, and two accommodating spaces 324 communicating to the upper end 320 and the lower end 322 respectively. The accommodating spaces 324 are spaced at intervals (namely, the accommodating spaces 324 are respectively an independent space and do not have communication between each other).

The illuminant device 30 further includes two conductive pins 33. The conductive pins 33 are electrically connected to an external power source 40 (as shown in FIG. 4) to obtain electric power for lighting the illuminant element 34.

The illuminant element 34 is disposed on the upper end 320 and emits light to a direction which is opposite to the lower end 322. The illuminant element 34 is alternating current light emitting diode (AC LED), which can be driven by alternating power source, such as AC 110 volt (V). However, in the practical application, the illuminant element 34 can be direct current (DC) LED, which is driven by DC power source, such as DC 5V.

Figure 4:
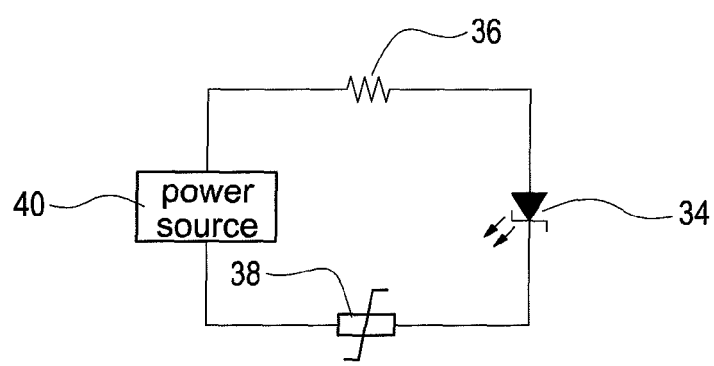
FIG. 4 is a circuit diagram of the illuminant device with over-temperature protecting function according to the present invention.

One end of the illuminant element 34 is connected to the resistor 36, and the other end of the illuminant element 34 is connected to the over-temperature element 38, therefore the resistor 36, the illuminant element 34, and the over-temperature element 28 are electrically connected in series, as shown in FIG. 4. The pins of the resistor 36 and over-temperature element 38 can connected to the pins of the illuminant element 34 by soldering. However, the pins of the resistor 36, the over-temperature element 38, and the illuminant element 34 can be respectively soldered on a circuit layer (not shown), and then the resistor 36, the over-temperature element 38, and the illuminant element 34 are electrically connected via the circuit layer.

Figure 5:
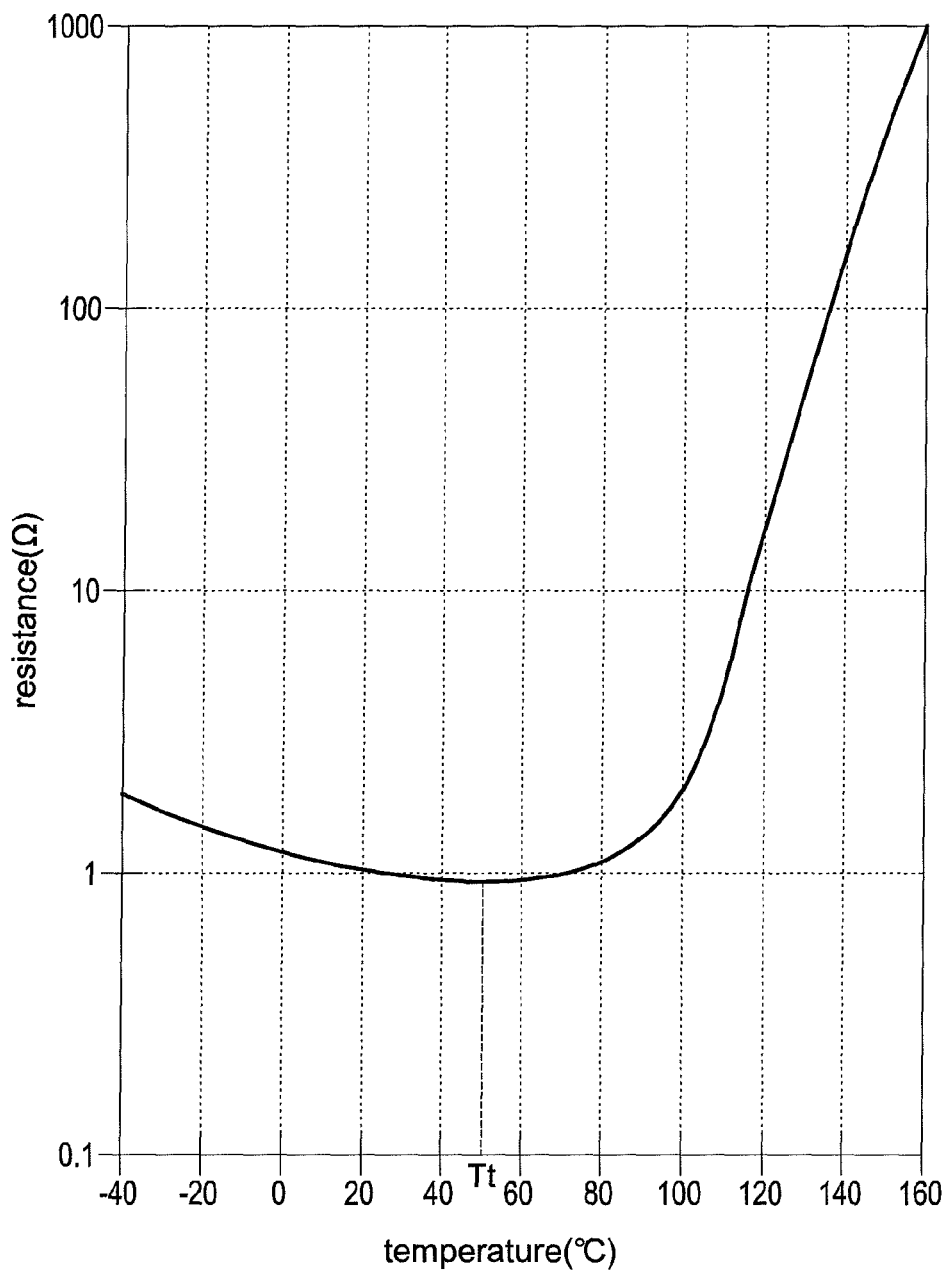
FIG. 5 is schematic a temperature to resistance curve of the over-temperature element according to the present invention.

The resistor 36 and the over-temperature element 38 are respectively disposed within the accommodating spaces 324 and respectively electrically connecter to the illuminant element 34 and the conductive pins 33. The over-temperature element 38 is used for sensing temperatures of the illuminant element 34, and is configured to selectively break the power source according to the sensed temperatures. In this embodiment, the over-temperature element 38 has characteristic of positive temperature coefficient (PTC). The over-temperature element 38 is, for example, a thermistor made by MURATA MANUFACTURING CO., LTD, and the characteristics curve of the over-temperature element 38 is shown in FIG. 5. When a sensed temperature sensed by the over-temperature element 38 is higher than a trigger temperature Tt, the resistance of the over-temperature element 38 rapidly increases in a short period. When a sensed temperature sensed by the over-temperature element 38 is lower than the trigger temperature, the resistance of the over-temperature element 38 returns to a normal range, and approach a constant. Therefore, when the temperature of the illuminant element 34 is higher than the trigger temperature Tt of the over-temperature element 38, the high resistance of the over-temperature element 38 blocks the power source form conducting to the illuminant element 34 (namely, to form an open circuit between the power source 40 and the illuminant element 34), such that the illuminant element 34 is extinguished. However, when the temperature of the illuminant element 34 decreases and is lower than the trigger temperature Tt due to short extinguished, the resistance of the over-temperature element 38 returns to normal value, and the illuminant element 34 is conducted again.

The automatic reset the characteristic of the over-temperature element 38 can effectively prevent the illuminant element 34 from aging and light attenuation. Moreover, the over-temperature protecting element 38 is disposed within the accommodating space 324 of the housing 30, which can prevent light emitted from the illuminant element 34 from blocking by the over-temperature element 38 that generates the problem of poor light uniformity. Furthermore, when the over-temperature element 38 damages, user can take the over-temperature element out form the accommodating space 324, place a normal over-temperature element within the accommodating space 324 and electrically connected to the illuminant element 34, the illuminant device 10 can be re-lit.

The illuminant device 30 further includes a lamp shade 42 assembled with the upper end 320 of the housing 30, such that the illuminant element 34 is arranged between the housing 30 and the lamp shade 42. The lamp shade 34 is used for adjusting light emitted from the illuminant element 34.

To sum up, the illuminant device 30 according to the present invention via the over-temperature element 38 senses temperatures of the illuminant element 34, and is configured to selectively break the power source 40 according to the sensed temperature, such that the illuminant device 30 can prevent the illuminant element 34 form aging and light attenuation result in operating under high temperature environment, and thus the lifetime of the illuminant device 30 is increased.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. An illuminant device comprising:
a housing comprising an upper end, a lower end opposite to the upper end, a first accommodating space formed in a first tubular configuration and arranged between the upper end and the lower end, and a second accommodating space formed in a second tubular configuration and spatially isolated from the first accommodating space; an illuminant element placed on the upper end;
a resistor located within the first accommodating space and electrically connected to the illuminant element; and
an over-temperature protecting element located within the second accommodating space and arranged between the illuminant element and the lower end.

2. The illuminant device of claim 1, wherein the illuminant element is configured to be switched on and off between a specific temperature range.

3. The illuminant device of claim 1, wherein the resistor, the illuminant element, and the over-temperature protecting element are electrically connected in series.

4. The illuminant device of claim 1, wherein the over-temperature protecting element has a characteristic of positive temperature coefficient.

5. The illuminant device of claim 1, wherein the over-temperature element is a thermistor.

6. The illuminant device of claim 1, wherein the first accommodating space has a first upper opening associated with the upper end and a first lower opening associated with the lower end.

7. The illuminant device of claim 1, wherein the illuminant element comprises a light-emitting diode configured to be driven by an alternative current.

8. The illuminant device of claim 1, wherein the housing comprises a material of ceramic.

9. The illuminant device of claim 1, further comprising:
a cover connected to the housing and enclosing the illuminant element;
a first conductive pin electrically connected to the resistor; and
a second conductive pin electrically connected to the over-temperature element.

10. The illuminant device of claim 1, wherein the housing is substantially formed in a cylindrical shape.

11. The illuminant device of claim 1, wherein the housing further comprises a surface extending from the upper end to the lower end, and surrounding the first accommodating space and the second accommodating space.

12. The illuminant device of claim 1, wherein the illuminant element is configured not to emit light toward the upper end.

13. The illuminant device of claim 1, wherein the over-temperature protecting element is replaceable.

* * * * *